United States Patent
Sauvagerd

Patent Number: 5,974,156
Date of Patent: Oct. 26, 1999

[54] CIRCUIT ARRANGEMENT FOR INFLUENCING THE FREQUENCY RESPONSE OF A DIGITAL AUDIO SIGNAL

[75] Inventor: Ulrich Sauvagerd, Hamburg, Germany

[73] Assignee: U.S. Philips Corporation, New York, N.Y.

[21] Appl. No.: 09/011,456

[22] PCT Filed: May 29, 1997

[86] PCT No.: PCT/IB97/00614

§ 371 Date: Feb. 10, 1998

§ 102(e) Date: Feb. 10, 1998

[87] PCT Pub. No.: WO97/49179

PCT Pub. Date: Dec. 24, 1997

[30] Foreign Application Priority Data

Jun. 19, 1996 [DE] Germany ............... 196 24 362

[51] Int. Cl.[6] ............... H03G 5/00; H03G 7/00
[52] U.S. Cl. ............... 381/98; 381/103; 381/106; 333/28 T
[58] Field of Search ............... 381/98, 101, 102, 381/103, 104, 106, 109, 107; 333/14, 28 T, 28 R; 375/350

[56] References Cited

U.S. PATENT DOCUMENTS

| | | | |
|---|---|---|---|
| 4,376,916 | 3/1983 | Glaberson | 333/14 |
| 4,696,044 | 9/1987 | Waller, Jr. | 381/106 |
| 4,739,514 | 4/1988 | Short et al. | 381/103 |
| 4,940,977 | 7/1990 | Mandell | 341/143 |
| 4,972,164 | 11/1990 | Akagiri et al. | 381/106 |
| 5,170,437 | 12/1992 | Strahm | 381/106 |
| 5,369,711 | 11/1994 | Williamson, III | 381/104 |
| 5,444,788 | 8/1995 | Orban | 381/106 |
| 5,574,791 | 11/1996 | Orban | 381/104 |
| 5,737,434 | 4/1998 | Orban | 381/104 |
| 5,754,666 | 5/1998 | Nakagawa | 381/98 |
| 5,907,623 | 5/1999 | Mercs et al. | 381/106 |

FOREIGN PATENT DOCUMENTS

0504988A2  9/1992  European Pat. Off. ......... H03G 5/16

*Primary Examiner*—Forester W. Isen
*Assistant Examiner*—Xu Mei
*Attorney, Agent, or Firm*—Edward W. Goodman

[57] ABSTRACT

A digital circuit arrangement for influencing the frequency response of a digital audio signal as a function of frequency and/or amplitude, in which the input signal of the digital circuit arrangement is applied to a signal filter (3) having variable filter coefficients, the output signal of the signal filter (3), after addition to the input signal of the digital circuit arrangement, represents the frequency response-influenced output signal of the digital circuit arrangement, and the coefficients for the signal filter (3) are selected in dependence on the output signal of a control circuit to which the output signal of the signal filter (3) is applied, and which includes a control filter (7), a rectifier (8), a pulse shaper stage (9), a logarithmic circuit (12) and a circuit for determining the coefficients.

18 Claims, 2 Drawing Sheets ially reproduced. Such known systems are, for example, the DBX, the HIGHCOM system and the various Dolby systems. In the latter noise suppression systems, a predefined effect on the audio signals, is set as a function of the frequency and the amplitude of a signal. Such systems are usually referred to as sliding-band systems.

CIRCUIT ARRANGEMENT FOR INFLUENCING THE FREQUENCY RESPONSE OF A DIGITAL AUDIO SIGNAL

BACKGROUND OF THE INVENTION

1. Field of the Invention

The invention relates to a digital circuit arrangement for influencing the frequency response of a digital audio signal as a function of frequency and/or amplitude.

2. Description of the Related Art

Such circuit arrangements are particularly necessary in noise suppression systems which are to suppress the noise arising after a sound carrier has been recorded and subsequently reproduced. Such known systems are, for example, the DBX, the HIGHCOM system and the various Dolby systems. In the latter noise suppression systems, a predefined effect on the audio signals, is set as a function of the frequency and the amplitude of a signal. Such systems are usually referred to as sliding-band systems.

An encoder is provided for these noise suppression systems which increases the upper frequency range of the audio signal at the recording end, for example, as a function of the frequency and/or amplitude of the signal, and a decoder which reduces the same frequency range in a mirror-inverted manner.

For most noise suppression systems of the type described above, it holds that only circuit arrangements operating in the analog mode are known for them. The cause of this is that the circuit arrangements are generally used only for analog audio signals. Of late, however, digitally operating devices for reproducing audio signals have increasingly been marketed, which are also to be suitable for the reproduction of, for example, audio signals.

SUMMARY OF THE INVENTION

In this connection, it is an object of the invention to provide a digitally operating circuit arrangement which, similarly to a noise suppression system, can influence the frequency response of the digital audio signal as a function of frequency and/or amplitude.

According to the invention, this object is achieved in that the input signal of the circuit arrangement is applied to a signal filter having variable filter coefficients, whose output signal, after addition to the input signal of the circuit arrangement, represents the frequency response influenced output signal of the circuit arrangement, and in that the coefficients for the signal filter are selected in dependence on the output signal of a control circuit to which the output signal of the signal filter is applied and which includes a control filter, a rectifier, a pulse shaper stage, a logarithmic means and a circuit for determining the coefficients that produces the filter coefficients for the signal filter.

Contrary to the known analog arrangements, the circuit arrangement according to the invention does not operate recursively as this causes problems in digital signals. Yet, the circuit arrangement is capable of copying the properties of analog systems not only with respect to the amplitude behavior, but also with respect to the pulse behavior. A basic problem is in this context, that not the desired frequency and/or amplitude-dependent frequency-response curves can be indicated as a standard, but that certain main features of analog circuit arrangements are prescribed. The behavior of these circuit arrangements is not laid down, but substantially automatically results from its structure. If the behavior of these analog circuit arrangements is to be almost copied in the digital area, a corresponding digital circuit arrangement is to be arranged very flexibly i.e., it must be possible to obtain a substantially arbitrary amplitude and/or pulse behavior. If such a characteristic of a certain noise suppression system is to be copied, the respective frequency-response curves and the dynamic behavior of the circuit can only be determined by experiments.

In the digital circuit arrangement according to the invention, these requirements are satisfied in that a signal filter is included which works with variable filter coefficients. These filter coefficients can be set as desired, depending on the frequency and/or amplitude of the input signal of the circuit arrangement. This holds both for the static case where there is an input signal present having constant frequency and amplitude, and also for the dynamic case where the frequency and/or amplitude of the input signal changes.

The selection of a coefficient for the signal filter is made in a control circuit to which the output signal of the signal filter is applied. This control circuit includes a control filter which is followed by a rectifier. The output signal of the rectifier arrives at a pulse shaper stage which in its turn, is followed by a logarithmic means. In dependence on the output signal of the logarithmic means, the coefficients are set in a circuit determining the coefficients.

The design of the individual components of the circuit arrangement is different depending on the desired influence of the frequency response and on the desired dynamic behavior.

For example, the filter characteristic of the signal filter can be adapted to the desired frequency patterns which can be set as a function of the frequency and/or amplitude of the input signal. The control filter in the control circuit determines both the static and the dynamic behavior of the circuit arrangement. The filter curve of this filter can be designed such that the filter coefficients for the signal filter can be varied as desired. The pulse shaper determines the dynamic behavior. This is effected in that the rising and/or falling time constants of the signals coming from the control filter can be controlled in the pulse shaper. The selection of these time constants determines with which minimum time constants the filter coefficients are set to the new amplitude or frequency, respectively, after an amplitude and/or frequency jump of the input signal of the circuit arrangement. Since these values are different, as are the desired frequency-response curves for the signal filter and the characteristics of the control filter depending on the desired frequency-response control, no general rule can be given for these values. In most cases, it is, rather, the components or filter characteristics, respectively, that can be selected experimentally.

With the circuit arrangement, it is possible to provide quasi-random characteristics for influencing the frequency response. For this purpose, only the filter characteristics or coefficients, respectively, and the pulse shaper stage need to be adapted. Despite this large variability, the circuit arrangement has a simple structure.

European Patent Application 0 504 988 corresponding to U.S. Pat. No. 5,257,292 disclose a digital circuit arrangement for influencing the frequency response of a digital audio signal as a function of frequency and/or amplitude, in which the input signal of the circuit arrangement is applied to a signal filter having variable filter coefficients, while its output signal represents the frequency-response-influenced output signal of the circuit arrangement after addition to the input signal of the circuit arrangement, and in which the coefficients for the signal filter are selected in dependence on the output signal of a control circuit to which the input signal of the circuit arrangement is applied and which includes a control filter, a rectifier, a pulse shaper stage, a logarithmic means and a circuit determining the coefficients which produces the filter coefficients for the signal filter. However, the known circuit arrangement used in practice does not always optimally satisfy the requirements made, for example, on a Dolby system. Surprisingly, it has appeared that a considerable improvement of the behavior of the circuit arrangement can be achieved without additional circuitry in that, as a modification of the circuit arrangement known from European Patent Application 0 504 988, the control circuit is supplied with the output signal of the signal filter in lieu of the input signal of the circuit arrangement.

In an embodiment of the invention, there is provided that the pulse shaper comprises a rise time filter and a decay time filter, which are low-pass filters and which influence the pulse behavior of the signals passing through the pulse shaper, so that the rise time filter determines the minimum time constant of rising edges of the signal, and the decay time filter determines the minimum time constant of falling edges of the signal.

The rise time filter and the decay time filter determine the time constants which the edges of the signal passing through the pulse shaper may have as a minimum. The time constant of the rise time filter then determines what steepness rising edges of the signal may have. The decay time filter determines the time constant of the falling edges. These two filters influence the dynamic behavior of the circuit arrangement. In many cases, it is not desirable to adapt the frequency characteristic of the signal filter forthwith to the new amplitude and/or frequency after a frequency and/or amplitude jump of the input signal of the circuit arrangement. Rather this transition is made several times in a delayed manner. This delay, with which the influence of the frequency response on the new frequency and/or amplitude is set, can be set by the time constant of the rise time filter and the decay time filter.

In a further embodiment of the invention, the rise time filter works with a time constant that has changed as a function of the amplitude of its received signal and the filter works with rather small time constants for rather high amplitudes of the signal.

In many noise suppression circuits for which the digital circuit arrangement may be provided, the time constants can be selected to be different for the dynamic behavior that depends on the amplitude of the input signal of the circuit arrangement. For that case, the rise time filter may advantageously work with a variable time constant, which is varied as a function of the amplitude of the signal.

In a further embodiment, the rise time filter is a first-order digital filter which has the transfer function $$H(e^{j\omega T}) = \frac{e_0 + e_0 e^{-j\omega T}}{1 + f_1 e^{-j\omega T}}$$

with: T=1/F, F=sample frequency of the digital audio signal, $e_0$=$k_1$+output signal of the downstream decay time filter and $f_1$=$k_2$+inverted output signal of the downstream decay time filter.

Generally, the rise time filter needs only to be arranged as a first-order digital filter. Such a filter works with three filter coefficients. For the present application, however, two coefficients will suffice, so that only the coefficients $e_0$ and $f_1$ are to be set. For adapting the characteristic of the rise time filter to the amplitude of the input signal, the coefficient $e_0$ is formed by a constant value $k_1$ and the output signal of the filter. The coefficient $f_1$ is formed by a constant value $k_2$ of the inverted output signal of the filter. In this manner, there is achieved that the two filter coefficients in $e_0$ and $f_1$ are varied as a function of the signal amplitude.

In further embodiments of the invention, the control filter is a high-pass filter and the control filter is arranged as a first-order digital filter which has the transfer function $$H(e^{j\omega T}) = \frac{c_0 + c_1 e^{-j\omega T}}{1 + d_1 e^{-j\omega T}}$$

where T=1/F, F=sample frequency of the digital audio signal, and filter coefficients $c_0$, $c_1$, $d_1$ have constant values.

The dimensioning of the filter coefficients $c_0$, $c_1$ and $d_1$ determines both the static and the dynamic behavior of the circuit arrangement.

Also the signal filter can, as is provided in a further embodiment of the invention, be arranged as a first-order digital filter which has the following transfer function:

$$H(e^{j\omega T}) = \frac{a_0 + a_0 e^{-j\omega T}}{1 + b_1 e^{-j\omega T}}$$

in which: T=1/F, F=the sample frequency of the digital audio signal and in which the coefficients $a_0$ and $b_1$ of the filter are variable and selected in dependence on the output signal of the control circuit.

Two filter coefficients $a_0$ and $b_1$, which are variable, however, are sufficient here. These filter coefficients are selected in dependence on the output signal of the control circuit. These coefficients may be selected in such a way that the desired frequency response variations are achieved with the output signal, of the signal filter to which is added the input signal of the circuit arrangement. Since theoretically determining these values is also extremely costly, they are determined best by experiments.

In an embodiment of the invention, the circuit for determining the coefficients includes a ROM which is triggered by the output signal of the logarithmic means and at least 100 values of the filter coefficients necessary for the signal filter are stored in the ROM.

The filter coefficients needed may be stored in a simple manner in a ROM in which they are recalled in dependence on the output signal of the logarithmic means. For the two filter coefficients, it is generally sufficient to store 100 values each. In this manner, there may thus be achieved at least 100 different frequency response variations. These step-by-step variations of the frequency response are generally no longer audible and are sufficient for most noise suppression systems. For a refinement of the step-by-step variations, however, over 100 values can be stored.

In a further embodiment of the invention, the circuit for determining the filter coefficients calculates the filter coefficients necessary for the signal filter in dependence on the output signal of the logarithmic means in accordance with predefined mathematical equations.

Instead of a ROM, the circuit determining the coefficients may advantageously calculate the filter coefficients. Mathematical equations may then be defined according to which the filter coefficients are calculated. Compared with the solution with the ROM, this solution is then particularly advantageous when the circuit arrangement is to have a good distortion behavior and, consequently, a great number of filter coefficients are necessary.

These filter coefficients can be advantageously calculated for the above signal filter with only two filter coefficients by means of the following equations:

$$a_0 = L_1 \times f(z) + L_2$$

$$b_1 = L_3 \times f(z) + L_4,$$

in which f(z) is the output signal of the logarithmic means (12), and in which $L_1$ to $L_4$ have predefined, constant values.

The circuit arrangement according to the invention, whose control may advantageously be effected by a digital signal processor, can more particularly be used for controlling the frequency response in accordance with the characteristics of analog noise suppression circuits. For example, the Dolby-B system is one. For example, for the decoding in accordance with the characteristics of analog Dolby-B circuits, it is sufficient to arrange the signal filter as a first-order low-pass filter.

In a further embodiment of the invention, the output signal of the signal filter, before addition to the input signal of the circuit arrangement, is applied to a limiter in which the signal is compared with a predefined amplitude value and the predefined value is selected so that exceeding this value indicates an activation of the limiting function when the digital signal is encoded.

In a preferred embodiment, the limiter is arranged as a digital limiter.

As is provided in further embodiments of the invention, the circuit arrangement may also be used for more complex noise suppression systems, for example, for generating frequency response characteristics in accordance with analog Dolby C circuits. On the one hand, this provides the possibility of connecting two circuit arrangements according to the invention after each other which operate autonomously. On the other hand, there is the possibility of arranging the signal filter and the control filter as second-order digital filters; one circuit arrangement according to the invention will then suffice.

These and other aspects of the invention will be apparent from and elucidated with reference to the embodiments described hereinafter.

DESCRIPTION OF THE PREFERRED EMBODIMENTS

Figure 1:
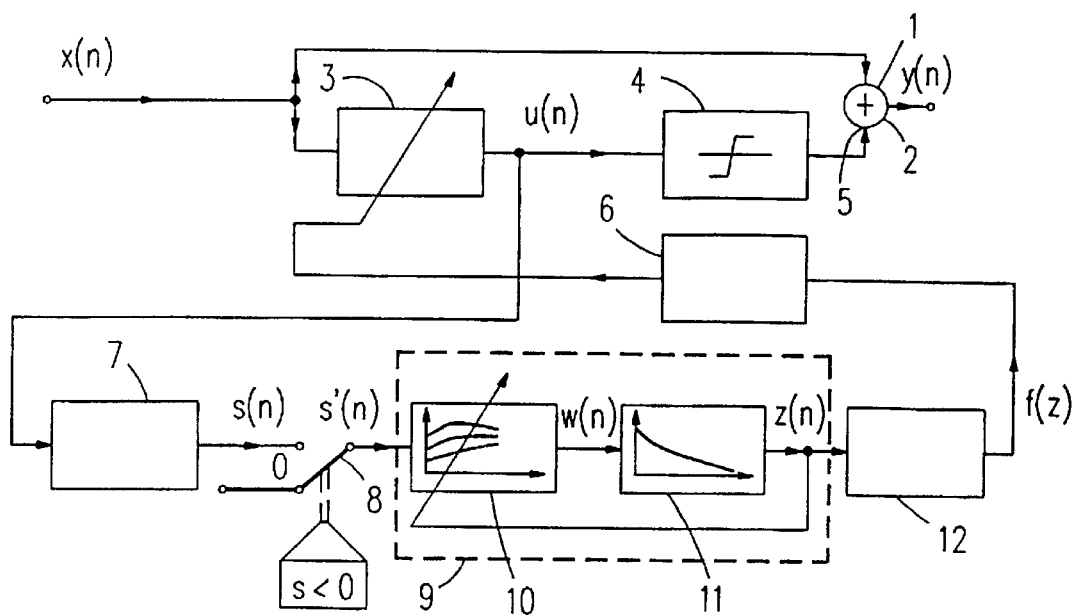
FIG. 1 shows a block circuit diagram of a digital circuit arrangement working as a Dolby-B decoder for frequency and amplitude-dependent frequency response control of a digital audio signal, FIG. 2 gives a detailed representation of the signal filter of the arrangement shown in FIG. 1, FIG. 3 gives a detailed representation of the signal filter of the arrangement shown in FIG. 1, and FIG. 4 gives a detailed representation of the pulse shaper stage of the arrangement shown in FIG. 1.

A digital circuit arrangement shown in FIG. 1 in the form of a block circuit diagram is arranged as a decoder which generates frequency response characteristics according to the Dolby-B system. For this purpose, the circuit arrangement is supplied with a digital audio signal x(n) which may be, for example, an audio signal converted from the analog to the digital form.

This signal is applied, in the circuit arrangement to a first input 1 of an adder 2 and to a signal filter 3. The output signal of the signal filter 3 is applied to a limiter 4 whose output signal is applied to a second input 5 of the adder 2. The output signal of the adder 2, which is referenced y(n), represents the decoded output signal of the circuit arrangement.

The digital audio signal thus passes through a main circuit in which it is not controlled, and also a sub-circuit in which it passes through the signal filter 3 and the limiter 4. The signals of the main and sub-circuits are added together and form the output signal y(n) of the circuit arrangement.

The signal filter 3 is used for controlling the frequency response of the signal x(n) in a desired manner as a function of its frequency and amplitude. This is a first-order low-pass filter which has variable filter coefficients for the desired frequency response control. The filter coefficients for the signal filter 3 are applied thereto by a circuit 6, for determining the coefficients. This circuit, determining the coefficients is triggered by the output signal of a control circuit to be further described in the following.

The control circuit, whose input is supplied with the output signal u(n) of the signal filter 3, comprises a control filter 7 which is a first-order digital filter operating with constant filter coefficients. The characteristic of this filter influences both the static behavior and the dynamic behavior of the circuit arrangement. If, as is shown in the example in the drawing, the circuit arrangement is to operate as a decoder for a Dolby-B system, this filter may be arranged as a high-pass filter.

The output signal of the control filter 7, referenced s(n) in FIG. 1, is applied to a rectifier, shown as a switch 8 in FIG. 1, which suppresses signal values s(n)<0. The rectified signal s'(n) subsequently reaches a pulse shaper stage 9. In the pulse shaper stage 9, the rise time and decay time of the signal s'(n) are influenced by time constants. For this purpose, the pulse shaper stage 9 includes a rise time filter 10 which determines the minimum time constant of rising edges of the signal applied thereto. The rise time filter 10 in the pulse shaper stage 9 is followed by a decay time filter 11 which works with a fixed time constant and thus also with fixed predefined filter coefficients. This filter 11 determines the minimum time constant of falling edges of the signal w(n) applied thereto. The rise time filter 10, on the other hand, is arranged as a variable filter whose filter coefficients are selected in dependence on the output signal z(n) of the decay time filter 11. The output signal of the decay time filter 11 represents the output signal of the pulse shaper stage 9 and subsequently reaches a logarithmic means 12 which determines the logarithmic value of this signal. This is preferably a modified logarithmic means which calculates, from the output signal z(n) of the pulse shaper stage 9 its output signal f(z) according to the equation $f(z) = A + Bz^{1/3} + Cz^{2/3}Dz$, in which A, B, C and D have constant values. The output signal of the logarithmic means 12 represents a kind of pointer which is applied to the circuit 6 for determining the coefficients and which triggers the desired selection of the filter coefficient for the signal filter 3 in this read-only memory.

The behavior of the circuit arrangement shown in FIG. 1 may be set to the desired type influencing the frequency response. It will be evident that the signal filter 3, or the variable filter coefficients supplied thereto, respectively, are to be arranged so that, after addition in the adder 2 to the input signal of the circuit arrangement, the desired characteristics may be provided for influencing the frequency response. The selection of the filter coefficients in the circuit 6, for determining the coefficients is made by the control circuit. In this control circuit, the control filter 7 influences both the static and the dynamic behavior of the circuit arrangement. With respect to the static behavior, the pulse shaper stage 9 substantially has no effect. Thus, if an input signal x(n) having a constant frequency and amplitude is available, the signal filter and the then switched-off pulse shaper stage 9, once the logarithmic value of the output signal has been calculated in the circuit 6, for determining the coefficients, a certain coefficient pair will be selected and the signal filter 3 will be set to the desired frequency response control. If the frequency and/or amplitude of the input signal changes, the signal filter 3 can be set to a new frequency response. The transition to this new frequency response to be set, however, is effected with a certain dynamic behavior. This dynamic behavior of analog noise suppression systems is not explicitly laid down in the specifications. The dynamic behavior is rather shown in that certain analog circuit elements are provided which have a certain dynamic behavior in practice. For the design of the circuit arrangement according to the invention, only the dynamic behavior of these analog arrangements can be measured and simulated with the digital circuit arrangement. The digital circuit arrangement can therefore also be designed by experiments. This dynamic behavior is determined by the rise time filter, the decay time filter or the minimum time constant for the selection of new coefficients determined thereby respectively, and also by the frequency response of the control filter.

In the arrangement shown in FIG. 1 a changing signal x(n) will generate a new output signal s(n) of the control filter 7. But this does not directly lead to a change of the filter coefficients, because the changing signal s,(n), s'(n) respectively, is influenced by time constants in the pulse shaper stage 9, these time constants leading to the fact that the signal whose logarithm has been taken in logarithm unit 12 only slowly assumes the new set value. Thus, after various intermediate values for the filter coefficients have been selected, also in the circuit 6, for determining the coefficients, the new static value for the new input signal x(n) will not be set until after a transition time. The transition times to larger or smaller amplitudes or frequencies, respectively, of the input signal are determined by the time constants of the rise time filter 10 and the decay time filter 11 in the pulse shaper stage 9.

For limiting the signal in the decoder, the arrangement shown in FIG. 1 includes the limiter 4 to which the output signal of the signal filter 3 is applied. This limiter 4 multiplies its transit signal normally by the factor of 1, thus leaving it uninfluenced. Only when the circuit arrangement is supplied with signals whose amplitude exceeds a pre-defined value, will the signal passing through the limiter 4 be influenced by a factor of <1, so that this provides a limitation of the signal. Preferably, the limiter 4 is arranged as a "hard limiter" which clips the signal portions exceeding the predefined value.

Figure 2:
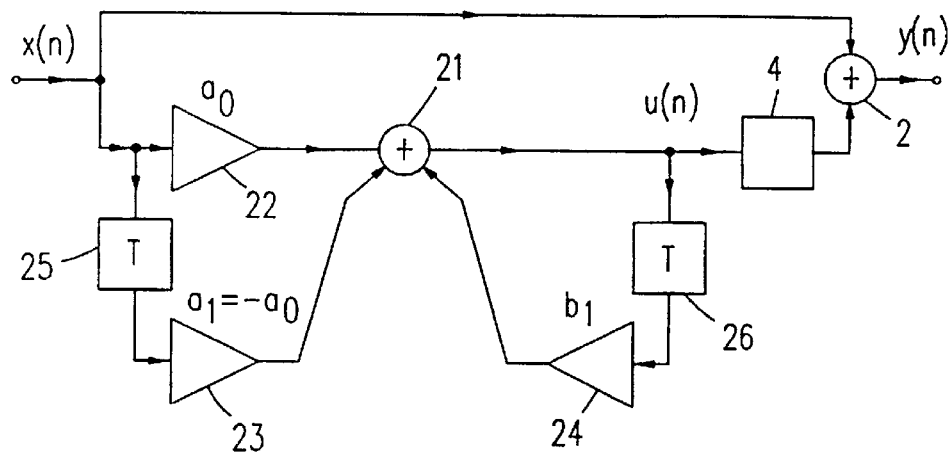

FIG. 2 shows the main and sub-circuit of the arrangement shown in FIG. 1 in more detail. More particularly, the signal filter 3 is shown as a detailed structure. The signal filter 3, which is a first-order digital low-pass filter, includes an adder 21 to which are applied the circuit arrangement input signal influenced in a multiplier 22 by a filter coefficient $a_0$, the circuit arrangement input signal delayed by one clock period in a delay element 25 and multiplied by a filter coefficient $a_1=-a_0$ in a multiplier 23, and the output signal u(n) of the adder 21 delayed by one clock period and multiplied by a filter coefficient $b_1$ in a multiplier 24. For generating decoder frequency response characteristics of the Dolby-B system, filter coefficients $a_0$ and $a_1$ for the multipliers 22 and 23 may be selected to be equal except for the sign. Thus, only the filter coefficients $a_0$ and $b_1$ are to be applied to the filter. These filter coefficients are selected in dependence on the output signal of the logarithmic means of the arrangement shown in FIG. 1 in the circuit 6 determining the coefficients.

The output signal u(n) of the adder 21, and thus of the signal filter 3, once it has passed through the limiter 4 and once the input signal x(n) of the circuit arrangement has been added thereto in the adder 2, reaches the output of the circuit arrangement and represents the output signal, that is, the decoded digital audio signal y(n) of the circuit arrangement.

Figure 3:
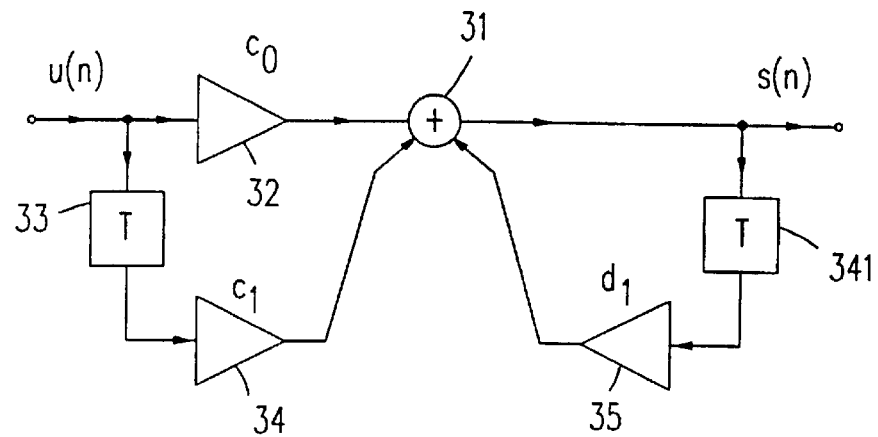

In FIG. 3 shows, in detail the signal filter 7 of the arrangement shown in FIG. 1. The input of the filter is supplied with the output signal u(n) of the signal filter 3. The signal filter shown in FIG. 3 is a first-order digital filter arranged as a high-pass filter. Such a high-pass characteristic is necessary for the decoding according to the frequency response characteristic of the Dolby-B system.

The signal filter shown in FIG. 3 includes an adder 31 to which is applied the output signal u(n) of the signal filter 3 after it has been multiplied by a filter coefficient $x_0$ in a multiplier 32. Furthermore, this output signal u(n) of the signal filter 3 is delayed by a sample clock period in a delay element 33 and subsequently influenced by a filter coefficient $c_1$ in a multiplier 34. The output signal of the multiplier 34 reaches a further input of the adder 31. The output signal of the adder 31 is led back to an input of the adder 31 via a delay element 341 in which this signal is delayed by one sample clock period, and a downstream multiplier 35 in which the output signal of the delay element 341 is influenced by a filter coefficient $d_1$. The output signal of the adder 31 simultaneously forms the output signal of the signal filter which is referenced s(n) in the Figure. This filter has the transfer function $$H(e^{j\omega T}) = \frac{c_0 + c_1 e^{-j\omega T}}{1 + d_1 e^{-j\omega T}}$$

The filter coefficients $c_0$, $c_1$ and $d_1$ have constant values so that the total circuit arrangement shown in FIG. 1 has the desired static and dynamic behavior.

Figure 4:
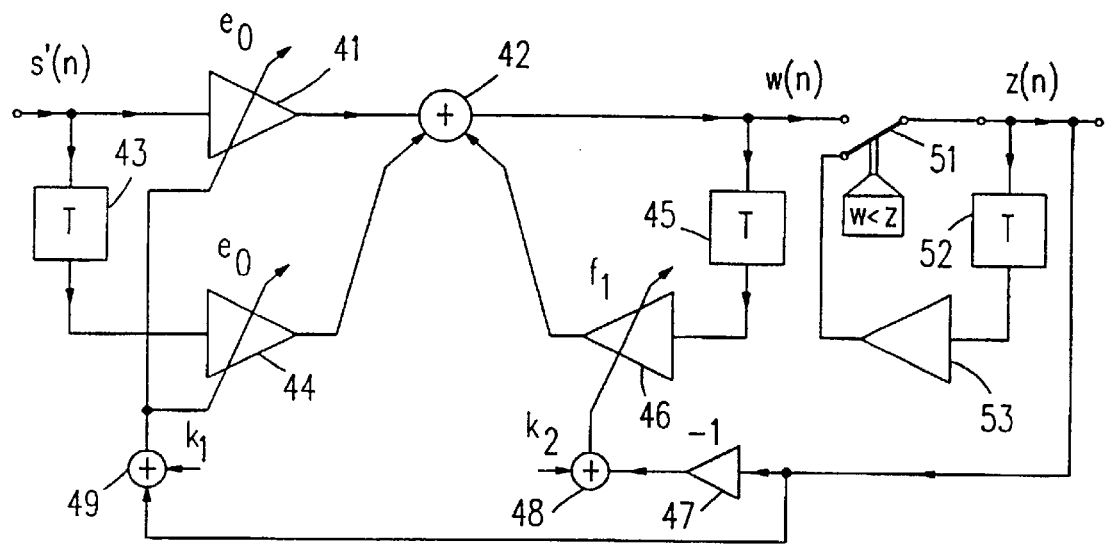

FIG. 4 further shows, in further detail the pulse shaper 9 shown in FIG. 1. More particularly, the rise time filter 10 and the decay time filter 11 are shown in detail in FIG. 4. The input of the pulse shaper shown in FIG. 4 is supplied with the rectified output signal s'(n) of the control filter. This signal is applied to an input of an adder 42 via a multiplier 41 in which it is influenced by a filter coefficient $e_0$. A further input of the adder 42 is supplied with the input signal s'(n) delayed by one sample clock period in a delay element 43 and subsequently influenced by the filter coefficient $e_0$ in a multiplier 44. The output signal of the adder 42 is fed back to a further input of the adder 42 via a delay element 45 in which it is delayed by one sample clock period, and a multiplier 46 downstream of the delay element 45, which multiplies this signal a filter coefficient $f_1$. The output signal of the adder 42, referenced w(n), also represents the output signal of the rise time filter.

The rise time filter is a variable rise time filter with respect to its filter coefficients $e_0$ and $f_1$. These filter coefficients $e_0$ and $f_1$ depend on the amplitude of the output signal z(n) of the decay time filter 11 downstream of the circuit arrangement. For this purpose, the signal z(n) is applied to an adder 49 in which a fixed value $k_1$ is added thereto. The output signal of the adder 49 now represents the filter coefficient $e_0$ for the multipliers 41 and 44.

For generating the filter coefficient $f_1$, the output signal $z(n)$ is inverted in a multiplier 47, thus multiplied by the value of −1 and, subsequently, a fixed value $k_2$ is added thereto in an adder 48. The output signal of the adder 48 forms the filter coefficient $f_1$ for the multiplier 46.

As a result, this type of generating filter coefficients $e_0$ and $f_1$ achieves that the filter characteristics of the filter are varied in dependence on the output signal $z(n)$ of the decay time filter 11 downstream in the circuit arrangement. Since the rise time filter determines the minimum time constant for rising edges of the signal $s'(n)$ applied thereto, the dynamic behavior of the overall circuit arrangement shown in FIG. 1 can be determined by selecting the filter coefficients $e_0$ and $f_1$. Since this behavior, for example, for Dolby-B circuits, is to depend on amplitude, the filter coefficients $e_0$ and $f_1$ are selected in dependence on the filter output signal $z(n)$ of the decay time filter 11. The magnitude of the filter coefficients $e_0$ and $f_1$ in the rise time filter determines the dynamic behavior of the circuit arrangement in the case of a transition from a rather low to a rather high amplitude of the digital audio signal, or in the case of a transition from a rather low to a rather high frequency of the audio signal.

FIG. 4 shows, in more detail, the decay time filter 11 of the arrangement shown in FIG. 1. This filter is a first-order filter that works with a constant filter coefficient $g_0$.

In the representation given in FIG. 1, this filter has a switch 51 switching either the output signal $w(n)$ of the rise time filter to the decay time filter output, or switching the output signal of the decay time filter, referenced $z(n)$ in the Figure, via a delay element 52 in which the signal is delayed by one sample clock period, and a multiplier 53 downstream in the circuit arrangement, in which multiplier 53, the signal passing through is influenced by the filter coefficient $g_0$, to the filter output. The switch 51 is selected in dependence on the value of the signal $w(n)$ in comparison with the value of the signal $z(n)$. During the periods of time in which the signal $w(n)$ has a smaller value than the signal $z(n)$, the output signal $z(n)$ is back to the output via the delay element 52 and the multiplier 53. In the remaining periods of time, the signal $w(n)$ directly goes to the output of the decay time filter 11 as output signal $z(n)$.

The output signal $z(n)$ of the decay time filter simultaneously represents the output signal of the pulse shaper stage 9 in FIG. 1.

The selection of the filter coefficient $g_0$ in the decay time filter determines the oscillation behavior of the circuit arrangement shown in FIG. 1, that is, the behavior in the case of a transition from a rather high to a rather low amplitude of the digital audio signal, or in the case of a transition from a rather high to a rather low frequency of the digital audio signal, respectively.

The digital first-order filters were described as a direct-form 1 filter. But, as usually recursive filters are used, these filters may advantageously be realized as so-called wave digital filters in which no stability problems occur. This especially applies to the stability under non-linear conditions.

I claim:

1. A digital circuit arrangement for influencing the frequency response of a digital audio signal as a function of frequency and/or amplitude, characterized in that the digital circuit arrangement comprises:

a signal filter having variable filter coefficients, said signal filter having an input for receiving an input signal of the digital circuit arrangement;

means for adding an output signal of said signal filter to the input signal of the digital circuit arrangement, an output signal of said adding means representing the frequency response influenced output signal of the circuit arrangement; and a control circuit for selecting the variable filter coefficients for the signal filter, said control circuit receiving the output signal of the signal filter and comprising:

a control filter for receiving the output signal of the signal filter;

a rectifier coupled to an output of said control filter;

a pulse shaper stage coupled to an output of said rectifier;

logarithmic means for determining a logarithmic value of an output of said pulse shaper stage; and a circuit for determining coefficients coupled to an output of said logarithmic means, an output of said determining means providing the variable filter coefficients for the signal filter.

2. A digital circuit arrangement as claimed in claim 1, characterized in that the pulse shaper stage comprises a rise time filter and a decay time filter, said rise time filter and said decay time filter being low-pass filters for influencing the pulse behavior of the rectifier output signal passing through the pulse shaper stage, whereby the rise time filter determines a minimum time constant of rising edges of the rectifier output signal, and the decay time filter determines a minimum time constant of falling edges of the rectifier output signal.

3. A digital circuit arrangement as claimed in claim 2, characterized in that the rise time filter has a time constant that changes as a function of the amplitude of the rectifier output signal, and has relatively small time constants for relatively high amplitudes of the rectifier output signal.

4. A digital circuit arrangement as claimed in claim 2, characterized in that the rise time filter is a first-order digital filter which has the transfer function $$H(e^{j\omega T}) = \frac{e_0 + e_0 e^{-j\omega T}}{1 + f_1 e^{-j\omega T}}$$

where $T=1/F$, $F$=sample frequency of the digital audio signal, $e_0=k_1+$output signal of the decay time filter, $f_1=k_2+$ inverted output signal of the decay time filter, and $k_1$ and $k_2$ are constants.

5. A digital circuit arrangement as claimed in claim 1, characterized in that the control filter is a high-pass filter.

6. A digital circuit arrangement as claimed in claim 1, characterized in that the control filter is a first-order digital filter which has the transfer function $$H(e^{j\omega T}) = \frac{c_0 + c_1 e^{-j\omega T}}{1 + d_1 e^{-j\omega T}}$$

where $T=1/F$, $F$=sample frequency of the digital audio signal, and filter coefficients $c_0$, $c_1$, $d_1$ have constant values.

7. A digital circuit arrangement as claimed in claim 1, characterized in that the signal filter is a first-order digital filter which has the following transfer function:

$$H(e^{j\omega T}) = \frac{a_0 - a_0 e^{-j\omega T}}{1 + b_1 e^{-j\omega T}}$$

where $T=1/F$, $F$=the sample frequency of the digital audio signal, and the coefficients $a_0$ and $b_1$ of the filter are variable and selected in dependence on the output signal of the logarithmic means.

8. A digital circuit arrangement as claimed in claim 1, characterized in that the circuit for determining coefficients includes a ROM which is addressed by the output signal of the logarithmic means, said ROM having at least 100 values of the filter coefficients for the signal filter stored therein.

9. A digital circuit arrangement as claimed in claim 1, characterized in that circuit for determining coefficients calculates the filter coefficients necessary for the signal filter in dependence on the output signal of the logarithmic means in accordance with predefined mathematical equations.

10. A digital circuit arrangement as claimed in claim 7, characterized in that said circuit for determining coefficients calculates the filter coefficients $a_0$ and $b_1$ using the following equations:

$$a_0 = L_1 \times f(z) + L_2$$

$$b_1 = L_3 \times f(z) + L_4,$$

in which $f(z)$ is the output signal of the logarithmic means and in which $L_1$ to $L_4$ have predefined, constant values.

11. A digital circuit arrangement as claimed in claim 1, characterized in that the logarithmic means takes a modified logarithmic value and calculates, from an input signal z, an output signal $f(z)$ according to the equation $$f(z) = A + Bz^{1/3} + Cz^{2/3} + Dz,$$

in which A, B, C and D have constant values.

12. A digital circuit arrangement as claimed in claim 1, characterized in that the digital circuit arrangement is controlled by a digital signal processor.

13. A digital circuit arrangement as claimed in claim 1, characterized in that the digital circuit arrangement is used for influencing the frequency response in accordance with the characteristics of an analog Dolby-B circuit.

14. A digital circuit arrangement as claimed in claim 13, characterized in that the digital circuit arrangement is used for decoding in accordance with the characteristics of analog Dolby-B circuits, and in that the signal filter is arranged as a first-order low-pass filter.

15. is circuit arrangement as claimed in claim 1, characterized in that the output signal of the signal filter before being added to the input signal of the digital circuit arrangement in the adding means, is applied to a limiter in which the signal filter output signal is compared with a predefined amplitude value, the predefined value being selected so that exceeding this value activates a limiting function when the digital signal is encoded.

16. A digital circuit arrangement as claimed in claim 15, characterized in that the limiter is a digital limiter.

17. A digital circuit arrangement as claimed in claim 1, characterized in that the digital circuit arrangement is used for influencing the frequency response in accordance with the characteristics of the analog Dolby-C circuit, and in that two autonomously operating digital circuit arrangements are connected in series.

18. A digital circuit arrangement as claimed in claim 1, characterized in that the digital circuit arrangement is used for influencing the frequency response in accordance with the characteristics of analog Dolby-C circuits, and in that the signal filter and the control filter are second-order digital filters.

* * * * *